(12) United States Patent
Kakimi et al.

(10) Patent No.: US 9,413,151 B2
(45) Date of Patent: Aug. 9, 2016

(54) ELECTRICAL JUNCTION BOX

(71) Applicants: Yazaki Corporation, Tokyo (JP);
TOYOTA JIDOSHA KABUSHIKI KAISHA, Toyota-shi, Aichi-ken (JP)

(72) Inventors: Takaaki Kakimi, Makinohara (JP); Koji Ueyama, Makinohara (JP); Kazuhiro Kusuyama, Okazaki (JP); Akinori Yamauchi, Nagoya (JP); Akira Sakuraba, Okazaki (JP)

(73) Assignees: YAZAKI CORPORATION, Tokyo (JP); TOYOTA JIDOSHA KABUSHIKI KAISHA, Aichi-ken (JP)

( * ) Notice: Subject to any disclaimer, the term of this patent is extended or adjusted under 35 U.S.C. 154(b) by 0 days.

(21) Appl. No.: 14/692,860

(22) Filed: Apr. 22, 2015

(65) Prior Publication Data

US 2015/0311688 A1 Oct. 29, 2015

(30) Foreign Application Priority Data

Apr. 23, 2014 (JP) ................. 2014-089024

(51) Int. Cl.
*H05K 5/03* (2006.01)
*H02G 3/14* (2006.01)
*B60R 16/023* (2006.01)
*H05K 7/02* (2006.01)
*H02G 3/08* (2006.01)

(52) U.S. Cl.
CPC .............. *H02G 3/14* (2013.01); *B60R 16/0238* (2013.01); *B60R 16/0239* (2013.01); *H05K 7/026* (2013.01); *H02G 3/081* (2013.01)

(58) Field of Classification Search
CPC .................................. B60R 16/0239
USPC ........................................... 439/76.2
See application file for complete search history.

(56) References Cited

U.S. PATENT DOCUMENTS

| 6,547,572 B1 * | 4/2003 | Burdick | ............. B60R 16/0238 439/76.2 |
| 7,072,188 B2 * | 7/2006 | Janisch | ............... B60R 16/0239 174/520 |
| 7,121,847 B1 * | 10/2006 | Jetton | .................. H01R 13/527 439/723 |

(Continued)

FOREIGN PATENT DOCUMENTS

| AT | 304684 B | 1/1973 |
| EP | 2521233 A2 | 11/2012 |

(Continued)

OTHER PUBLICATIONS

Search Report dated Sep. 17, 2015, issued by the European Patent Office in counterpart European Application No. 15164826.8.

*Primary Examiner* — Hung V Ngo

(74) *Attorney, Agent, or Firm* — Sughrue Mion, PLLC

(57) ABSTRACT

An electrical junction box includes a body case of the electrical junction box that has an opening part facing electrical components and has a case side locking part, and a cover that covers the opening part, is engaged to the body case of the electrical junction box, and has a cover side locking part. The cover is engaged to or disengaged from the body case of the electrical junction box with the case side locking part and the cover side locking part. The cover has a cover side abutting part to match a position of the cover side locking part. The body case of the electrical junction box has a case side abutting part to match a position of the case side locking part and a position of the cover side abutting part.

4 Claims, 10 Drawing Sheets

(56) References Cited

U.S. PATENT DOCUMENTS

| | | | |
|---|---|---|---|
| 7,672,116 B2 * | 3/2010 | Li | H02G 3/08 361/641 |
| 7,878,822 B2 * | 2/2011 | Korczynski | B60R 16/0238 220/326 |
| 2014/0049921 A1 | 2/2014 | Tsai et al. | |

FOREIGN PATENT DOCUMENTS

| | | |
|---|---|---|
| JP | 2012182965 A | 9/2012 |
| JP | 2012-213287 A | 11/2012 |
| JP | 2013-090407 A | 5/2013 |

* cited by examiner

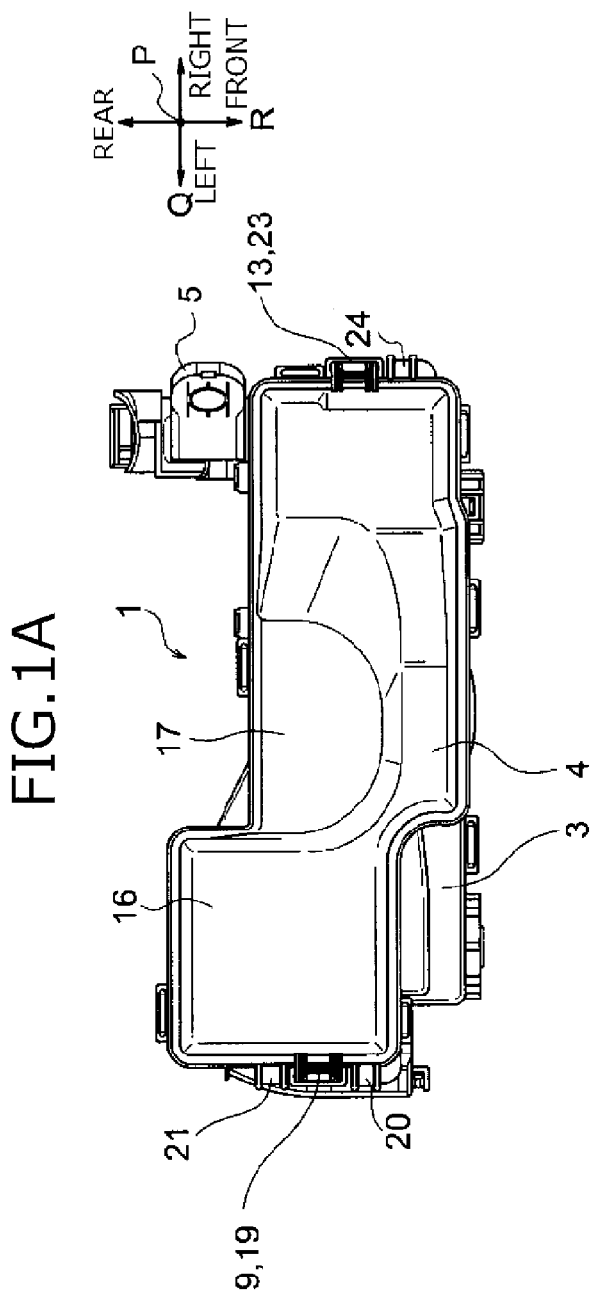

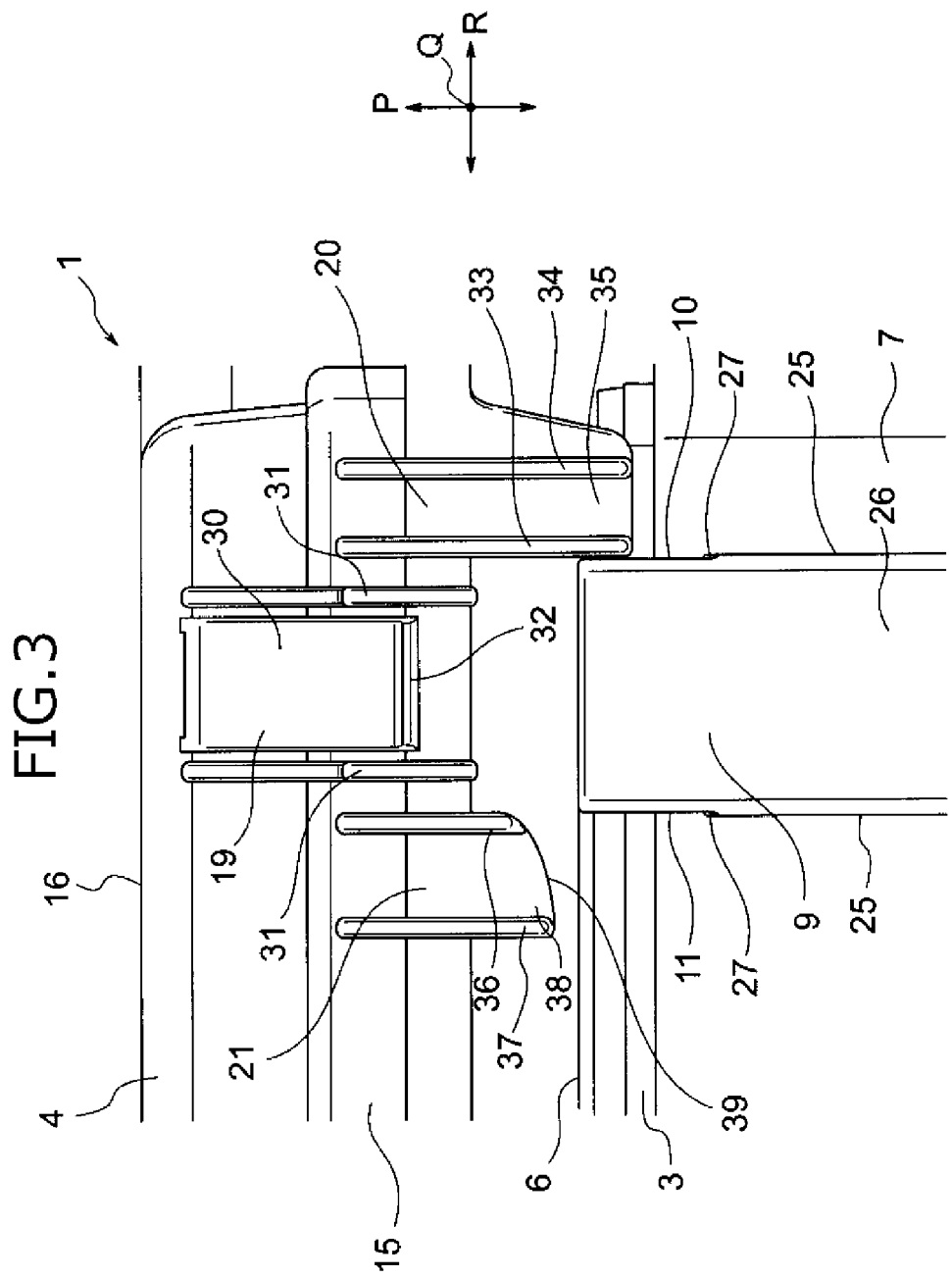

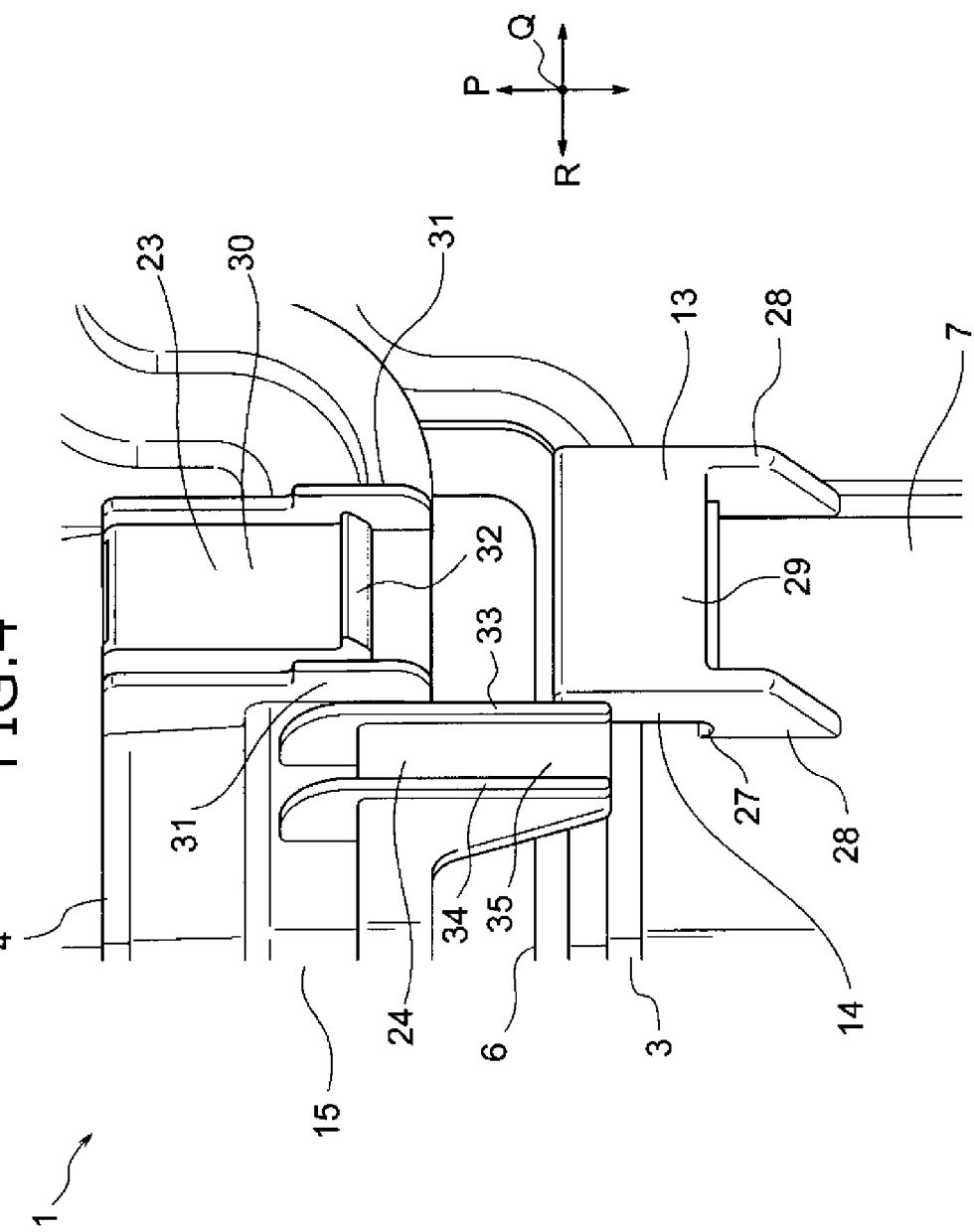

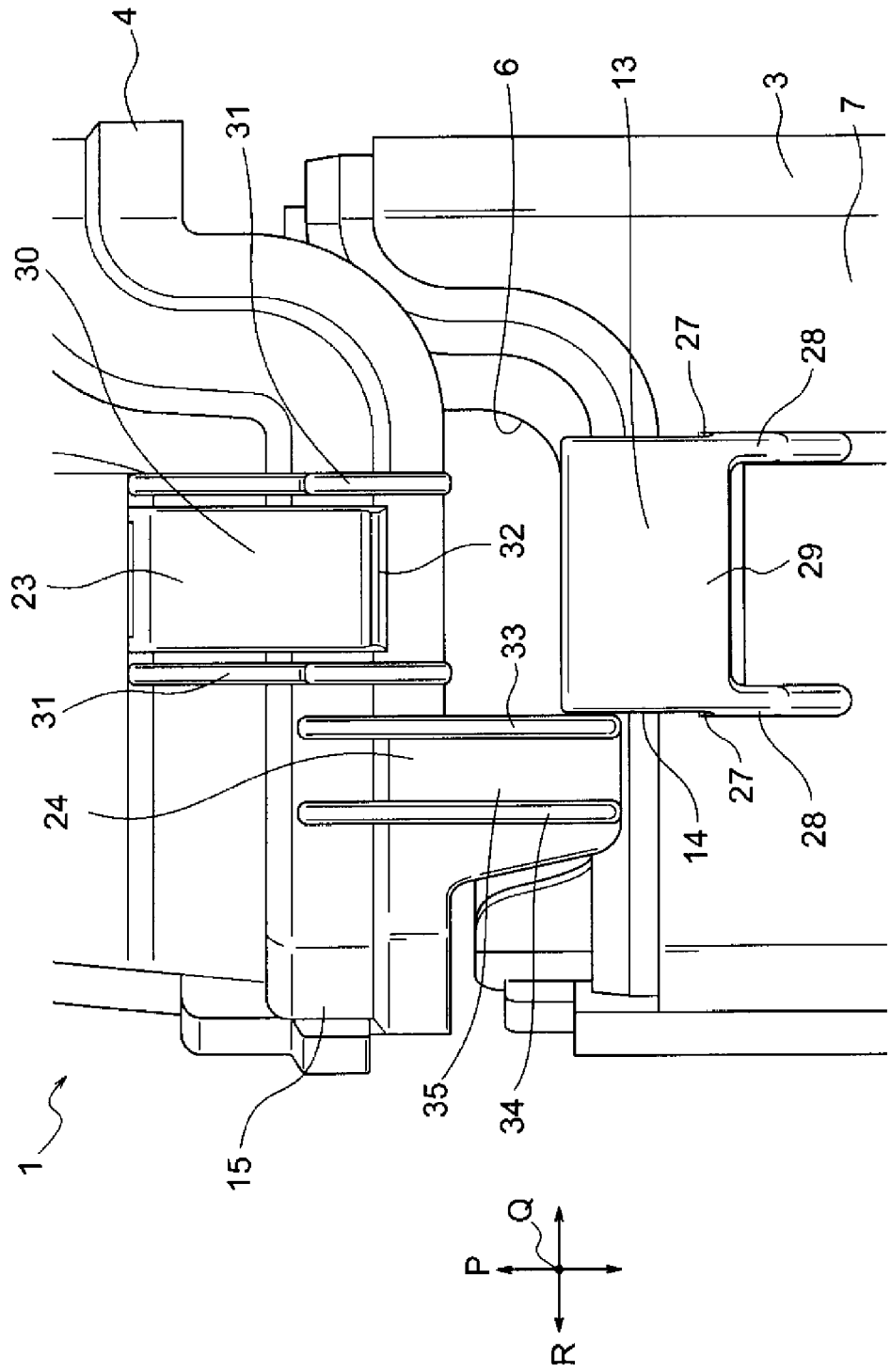

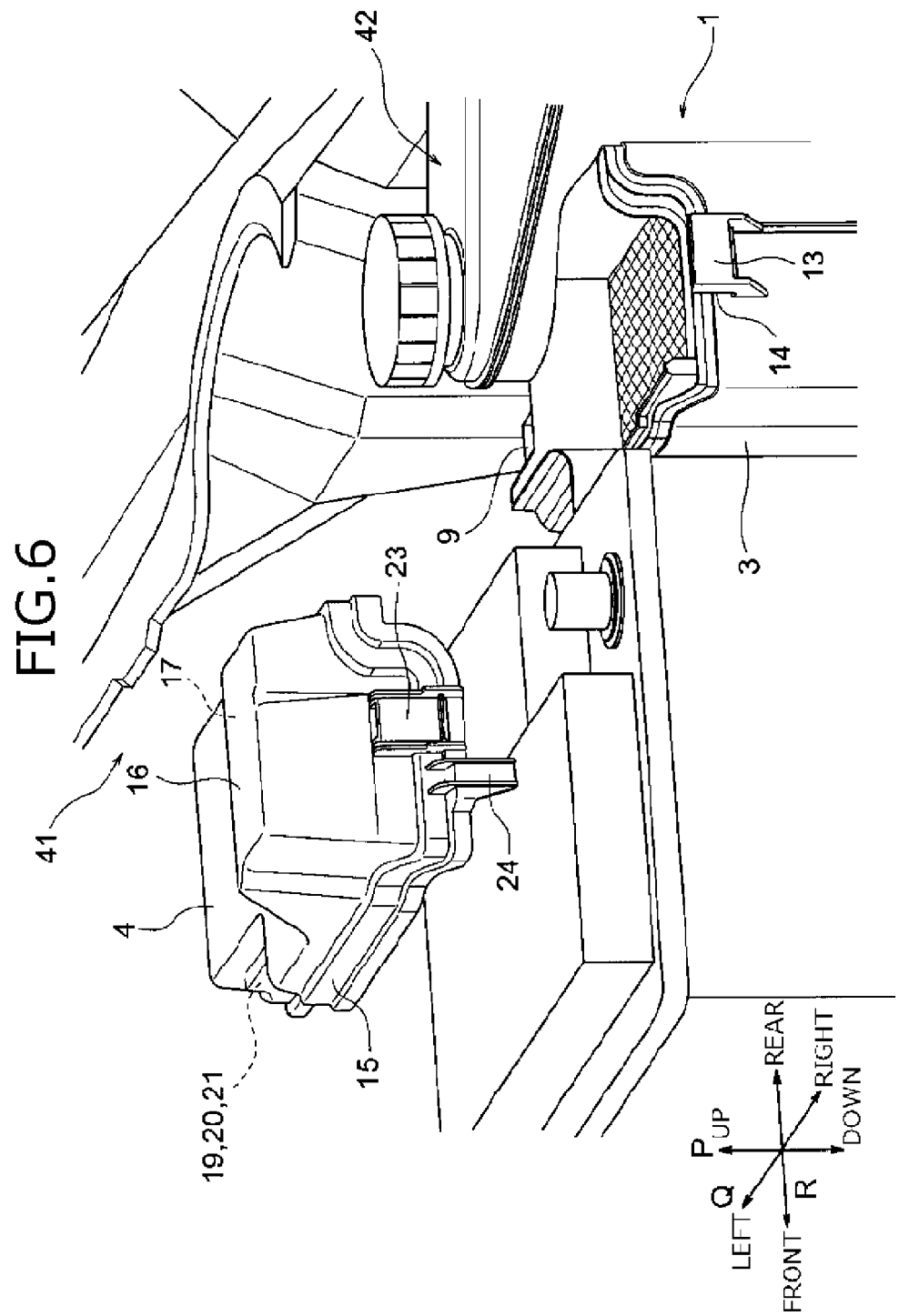

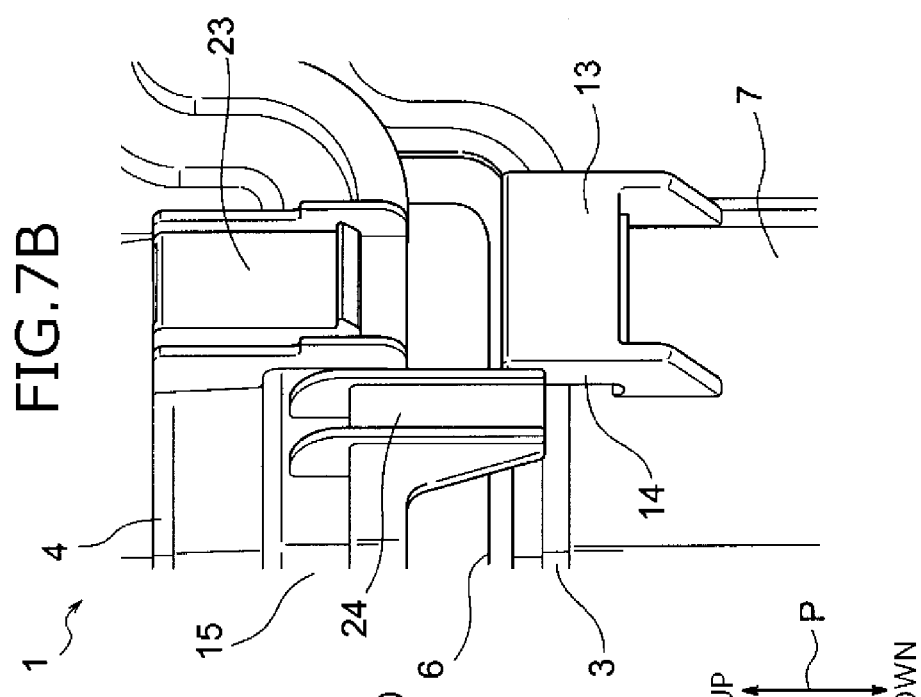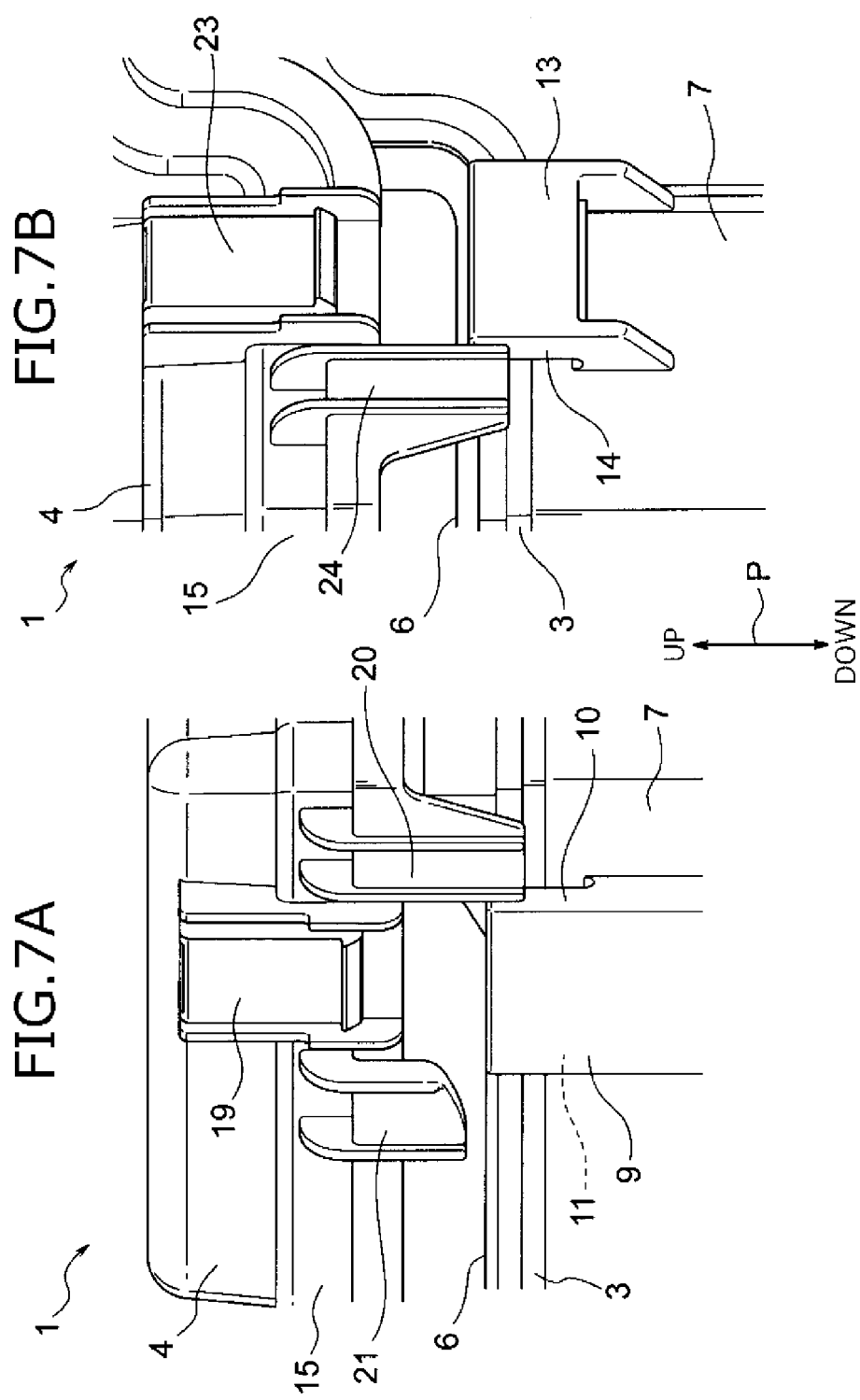

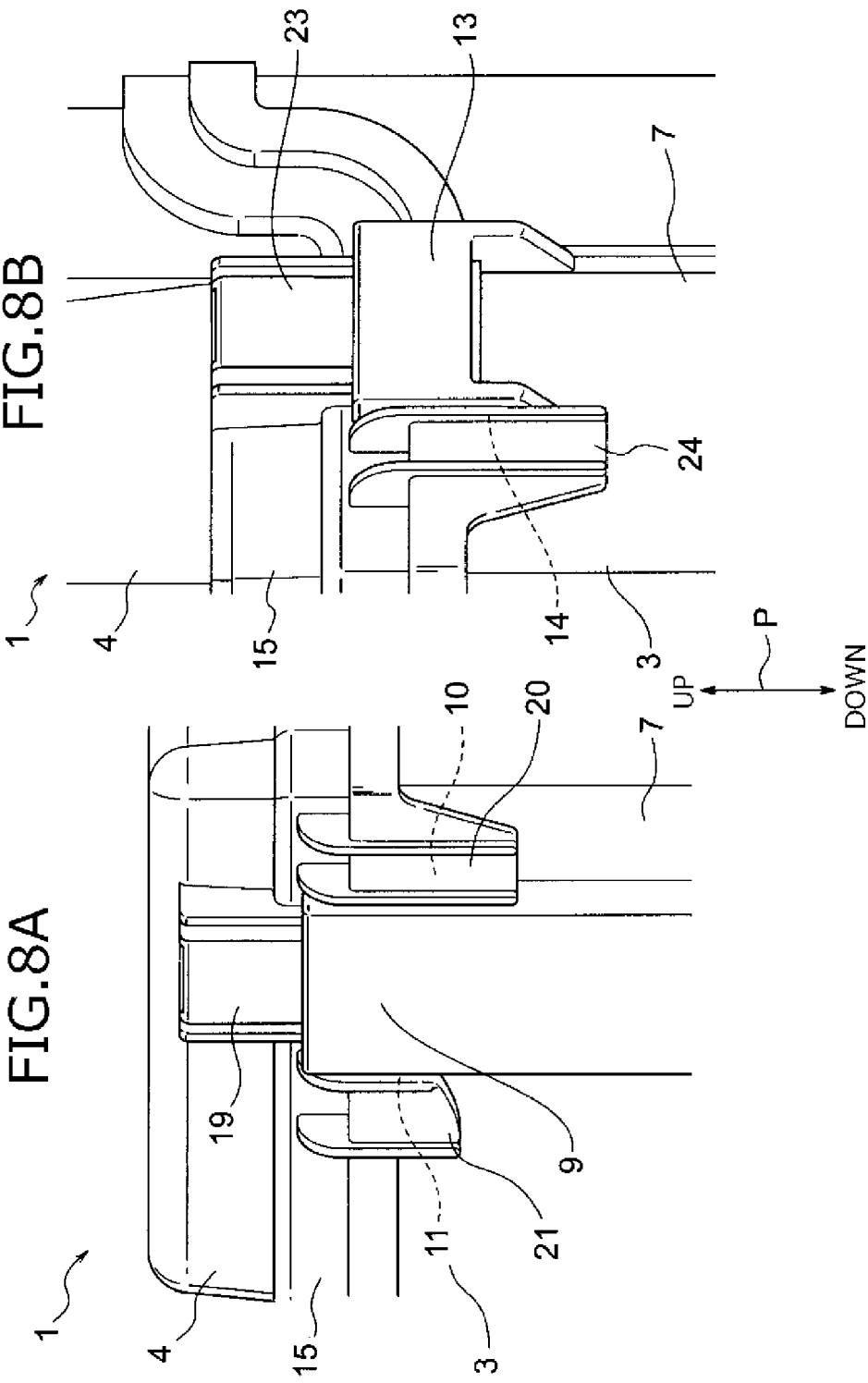

ELECTRICAL JUNCTION BOX

CROSS REFERENCE TO RELATED APPLICATION

This application is based on Japanese Patent Applications No. 2014-089024 filed on Apr. 23, 2014, the contents of which are incorporated herein by reference.

BACKGROUND OF THE INVENTION

1. Technical Field

The present invention relates to an electrical junction box which includes a body case of the electrical junction box that has an opening part facing electrical components, and a cover that covers the opening part and is engaged to the body case of the electrical junction box, and particularly to an electrical junction box which further includes a case side locking part and a cover side locking part with which the cover is engaged to or disengaged from the body case of the electrical junction box.

2. Background Art

Electrical apparatuses installed in a vehicle such as an automobile include, for example, an electrical junction box. The electrical junction box is known as a general term that refers to a relay box, a fuse box, a junction block or an electronic control unit box. Related art about the electrical junction box is disclosed in JP-A-2012-182965. The constitution of the electrical junction box is briefly described as follows.

The electrical junction box is installed in, for example, the engine room of an automobile. The electrical junction box includes an electrical junction box body as its functional portion and a cover. The electrical junction box body is a resin housing of the electrical junction box and has a body case of the electrical junction box. On the other hand, the cover is included to cover an opening part of the body case of the electrical junction box. Electrical components are mounted to positions facing the opening part of the body case of the electrical junction box. The electrical components become prevented from water in a state where the cover is engaged to the opening part of the body case to cover the opening part.

To make the cover and the body case of the electrical junction box engaged, the cover is formed with a cover side locking part. Further, the body case of the electrical junction box is formed with a case side locking part. A plurality of the cover side locking parts and the case side locking parts may be formed as needed. The cover side locking parts are formed into, for example, a cantilever arm shape having flexibility. The case side locking parts are formed as frame-formed portions having a substantially U-shaped cross section so that the cover side locking parts are hooked and engaged when the cover side locking parts return to the original positions after be flexed.

Regarding the engagement of the cover by an operator, when the cover is moved down from directly above the opening part of the body case of the electrical junction box, the cover side locking parts are hooked with the case side locking parts.

Thereby, the cover is engaged to the body case of the electrical junction box while covering the opening part. Regarding the disengagement of the cover by the operator, the cover side locking parts are flexed to be unlocked from the case side locking parts.

When the cover is removed by being disengaged from the body case of the electrical junction box, the operator can perform maintenance for the electrical junction box body.

In the related art, because the direction in which the cover is engaged to or disengaged from the body case of the electrical junction box is an upward/downward direction, there is a problem which is that it is very difficult to perform maintenance-related operations when there is no space above the electrical junction box.

The present invention is made in view of the above situation, and the object of the present invention is to provide an electrical junction box which makes it possible to improve maintenance-related operativity.

SUMMARY OF THE INVENTION

According to an aspect of the present invention, (1) an electrical junction box includes a body case of the electrical junction box that has an opening part facing electrical components and has a case side locking part, and a cover that covers the opening part, is engaged to the body case of the electrical junction box, and has a cover side locking part. The cover is engaged to or disengaged from the body case of the electrical junction box with the case side locking part and the cover side locking part, the cover has a cover side abutting part to match a position of the cover side locking part, the body case of the electrical junction box has a case side abutting part to match a position of the case side locking part and a position of the cover side abutting part, and the cover side abutting part and the case side abutting part are formed and arranged at positions where the cover side abutting part and the case side abutting part abut against each other when the opening part is covered with the cover and the cover is moved in a predetermined direction that intersects an engaging direction in which the cover is engaged to or disengaged from the body case of the electrical junction box.

(2) In the electrical junction box of (1), the cover side abutting part is arranged near the cover side locking part and formed into a wall-like or columnar shape which extends in the engaging direction, and the case side abutting part includes the case side locking part and is formed of a wall that extends in the engaging direction.

(3) In the electrical junction box of (1) or (2), the cover and the body case of the electrical junction box have a cover side supporting part and a case side supporting part, and the cover side supporting part and the case side supporting part are formed to, when the cover is moved in the engaging direction while the cover side abutting part abuts against the case side abutting part, guide the movement.

(4) In the electrical junction box of (3), the cover side supporting part and the case side supporting part are formed and arranged at positions to sandwich the cover side locking part and the case side locking part with the cover side abutting part and the case side abutting part.

According to the configuration (1), after the opening part of the body case of the electrical junction box is covered with the cover, when the cover is moved in a predetermined direction intersecting an engaging direction in which the cover is engaged to the body case of the electrical junction box, the cover side abutting part abuts against the case side abutting part by this movement. Temporarily, even when there is no enough space above the electrical junction box or when it is impossible to visually inspect the position where the cover is engaged to the body case of the electrical junction box, by the above-mentioned abutments, the cover can be precisely engaged to the body case of the electrical junction box. Therefore, according to the present invention, an effect is achieved which is that maintenance-related operativity can be improved.

According to the configuration (2), because the cover side abutting part and the case side abutting part are formed and arranged near the position where the cover side locking part and the case side locking part are engaged, in comparison to that the cover side abutting part and the case side abutting part are formed and arranged far away, the cover can be more precisely engaged to the body case of the electrical junction box. Therefore, according to the present invention, an effect is achieved which is that maintenance-related operativity can be improved.

According to the configuration (3), because when the cover is moved in the engaging direction while the cover side abutting par abuts against the case side abutting part, a guiding is performed by the cover side supporting part and the case side supporting part, the cover can be precisely and smoothly engaged to the body case of the electrical junction box. Therefore, according to the present invention, an effect is achieved which is that maintenance-related operativity can be improved.

According to the configuration (4), because the cover side supporting part and the cover side abutting part are formed and arranged at the position to sandwich the cover side locking part, and because the case side supporting part and the case side abutting part are formed and arranged at the position to sandwich the case side locking part, the cover can be engaged to the body case of the electrical junction box in a stable state without a position deviation. Therefore, according to the present invention, an effect is achieved which is that maintenance-related operativity can be improved.

BRIEF DESCRIPTION OF DRAWINGS

FIG. 1A is a top view which indicates an electrical junction box of the present invention.

FIG. 3 is a left side view which indicates a state just before the engagement of the left engaging portions.

FIG. 4 is a perspective view which indicates a state just before the engagement of the right engaging portions.

FIG. 5 is a right side view which indicates a state just before the engagement of the right engaging portions.

FIG. 6 is a perspective view which indicates that an upper cover is removed from a body case.

FIG. 7A includes a perspective view which indicates a state just before cover side and case side locking parts are engaged in a view from the left side.

FIG. 7B includes a perspective view which indicates a state just before cover side and case side locking parts are engaged in a view from the right side.

FIG. 8A includes a perspective view which indicates that cover side and case side locking parts are engaged in a view from the left side.

FIG. 8B includes a perspective view which indicates that cover side and case side locking parts are engaged in a view from the right side.

DESCRIPTION OF EMBODIMENTS

The electrical junction box includes a body case of the electrical junction box which has an opening part and a cover which covers the opening part and is engaged to the body case of the electrical junction box. The electrical junction box has such a structure that the cover is engaged to or disengaged from the body case of the electrical junction box with a case side locking part and a cover side locking part. The body case of the electrical junction box is formed with a case side abutting part. Further, the cover is formed with a cover side abutting part.

The electrical junction box has such a structure that when the opening part of the body case of the electrical junction box is covered with the cover and the cover is moved in a predetermined direction intersecting an engaging direction in which the cover is engaged to the body case of the electrical junction box, the cover side abutting part abuts against the case side abutting part by this movement. The engagement can be realized by moving the cover to the side of the body case of the electrical junction box when the cover and the electrical junction box case body are at the abutment position. Temporarily, even when there is no enough space above the electrical junction box 1 or when it is impossible to visually inspect the engagement position, the engagement can be precisely performed.

Below, an embodiment will be described with reference to the figures.

Figure 1B:
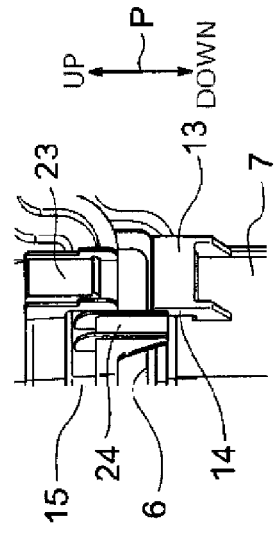
FIGS. 1B to 1E are perspective views which show a left engaging portion and a right engaging portion.
Figure 1C:
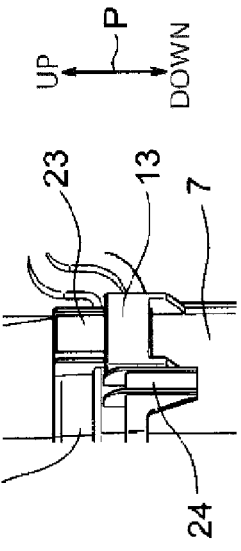
Figure 1D:
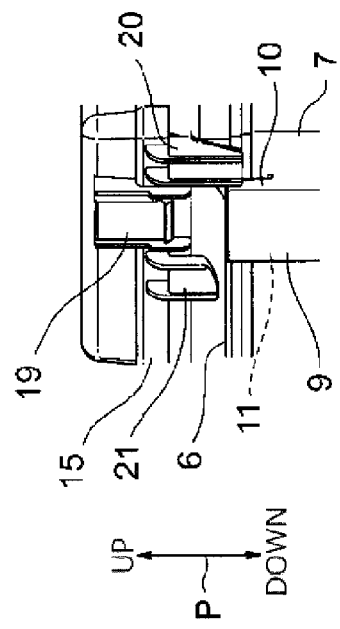
Figure 1E:
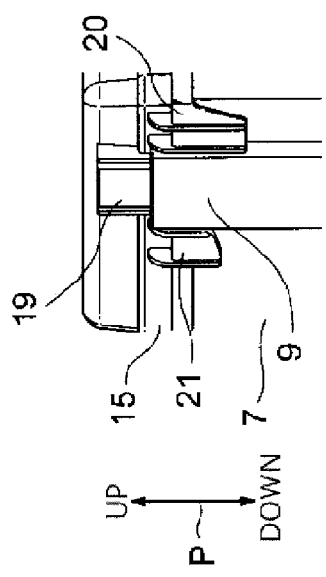
Figure 2:
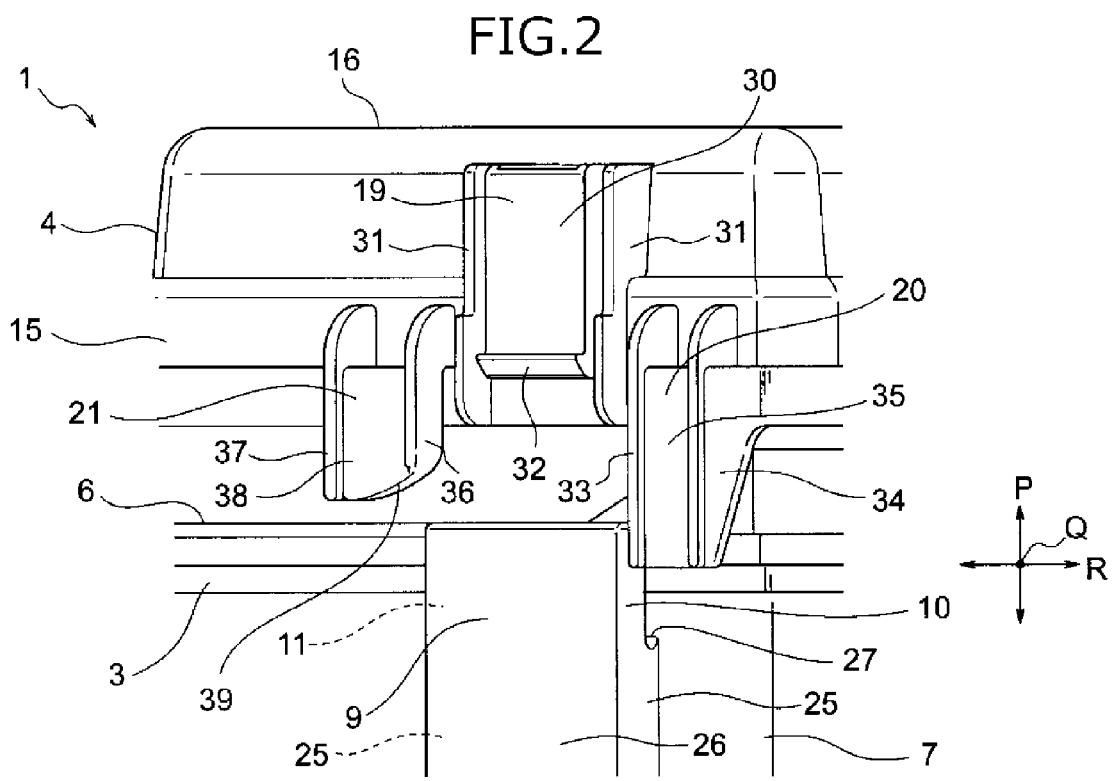
FIG. 2 is a perspective view which indicates a state just before the engagement of the left engaging portions.

FIG. 1A is a top view which indicates an electrical junction box of the present invention. FIG. 1B is a perspective view which indicates a state just before the engagement of the left engaging portions. FIG. 1C is a perspective view which indicates a state just before the engagement of the right engaging portions. FIG. 1D includes a perspective view which indicates a state just before cover side and case side locking parts are engaged in a view from the left side. FIG. 1E includes a perspective view which indicates a state just before cover side and case side locking parts are engaged in a view from the right side. FIG. 2 is a perspective view which indicates a state just before the engagement of the left engaging portions. FIG. 3 is a left side view which indicates a state just before the engagement of the left engaging portions. FIG. 4 is a perspective view which indicates a state just before the engagement of the right engaging portions. FIG. 5 is a right side view which indicates a state just before the engagement of the right engaging portions. In the figures, arrows P indicate upward/downward directions, arrows Q indicate rightward/leftward directions, and arrows R indicate frontward/rearward/directions.

In FIGS. 1A to 1E, an electrical junction box 1 installed by an automobile includes a body case 3 (body case of electrical junction box), an upper cover 4 (cover) which is attachable to or detachable from the body case 3, and a vehicle body fixing part 5. The electrical junction box 1 is a resin molded article.

The upper part of the body case 3 is formed as an opening part 6. A left sidewall 7 of the body case 3 is formed with a case side locking part 9, a case side abutting part 10 and a case side supporting part 11. Further, a right sidewall 7 of the body case 3 is formed with a case side locking part 13 and a case side abutting part 14. The case side locking parts 9, 13 are formed as portions to make the upper cover 4 engaged (locking portions). The case side abutting parts 10, 14 and the case side supporting part 11 are formed as one of the features of the present invention.

The upper cover 4 has frame-formed sidewalls 15 which are engaged to the upper ends of the sidewalls 7 of the body case 3, a top wall 16 and an obstacle avoiding part 17 which is formed by recessing the top wall 16. A left frame-formed sidewall 15 of the upper cover 4 is formed with a cover side locking part 19, a cover side abutting part 20 and a cover side supporting part 21. Further, a right frame-formed sidewall 15 of the upper cover 4 is formed with a cover side locking part 23 and a cover side abutting part 24. The cover side locking parts 19, 23 are formed as portions to make the upper cover 4 engaged to the body case 3 (locking portions). The cover side abutting parts 20, 24 and the cover side supporting part 21 are formed as one of the features of the present invention.

In FIGS. 1A to 3, the case side locking part 9 of the left sidewall 7 is formed into a barrel form which has a substantially U-shaped horizontal cross section and extends in the upward/downward direction. When the barrel form is described more in detail, the case side locking part 9 is formed into the barrel form to have a pair of projecting walls 25 which project shortly, perpendicularly to and outward from the left sidewall 7, and a connecting wall 26 which is parallel with the left sidewall 7 and connects ends of the pair of projecting walls 25. The case side locking part 9 is so formed that the inside becomes a space. The space is formed as an engaged space into which the cover side locking part 19 of the upper cover 4 is engaged (a space into which the cover side locking part 19 is inserted (inserted space)).

An inner surface of the connecting wall 26 that faces the engaged space (inserted space) is formed with a hooking part not shown. The hooking part is formed as a part with which the cover side locking part 19 of the upper cover 4 is hooked. The hooking part is so formed that the hooking occurs due to, for example, a projection or a step.

The outer surfaces of the pair of projecting walls 25 are formed to extend in the upward/downward direction as long, flat surfaces. One of the pair of projecting walls 25 (front projecting wall 25) is formed as the case side abutting part 10. The case side abutting part 10 (front projecting wall 25) is formed as a portion against which the cover side abutting part 20 of the upper cover 4 abuts. Further, the case side abutting part 10 (front projecting wall 25) is formed as a portion on which the cover side abutting part 20 slides in the upward/downward direction.

The other of the pair of projecting walls 25 (back projecting wall 25) is formed as the case side supporting part 11. The case side supporting part 11 (back projecting wall 25) is formed to collaborate with the cover side supporting part 21 of the upper cover 4 to serve a guiding function.

Slits 27 are formed at base end portions of the pair of projecting walls 25, respectively. The slits 27 are formed so that it is possible to insert the left frame-formed sidewall 15 of the upper cover 4 into the slits 27. The slits 27 are cut to only have a width which is necessary for the left frame-formed sidewall 15 of the upper cover 4 to be lapped onto the outside of the left sidewall 7 of the body case 3.

In FIGS. 1A, 1C, 1E, 4 and 5, the case side locking part 13 of the right sidewall 7 is formed into a frame form (gate form) which has a substantially U-shaped horizontal cross section and extends in the upward/downward direction. When the frame form is described more in detail, the case side locking part 13 is formed into the frame form to have a pair of projecting walls 28 which project shortly, perpendicularly to and outward from the right sidewall 7, and a band-shaped connecting band wall 29 which is parallel with the right sidewall 7 and connects ends of the pair of projecting walls 28. The case side locking part 13 is so formed that the inside becomes a space. The space is formed as an engaged space into which the cover side locking part 23 of the upper cover 4 is engaged (a space into which the cover side locking part 19 is inserted (inserted space)).

An inner surface of the connecting band wall 29 that faces the engaged space (inserted space) is formed with a hooking part not shown. The hooking part is formed as a part with which the cover side locking part 23 of the upper cover 4 is hooked. The hooking part is so formed that the hooking occurs due to, for example, a projection or a step.

The outer surfaces of the pair of projecting walls 28 are formed to extend in the upward/downward direction as short, flat surfaces. One of the pair of projecting walls 28 (front projecting wall 28) is formed as the case side abutting part 14. The case side abutting part 14 (front projecting wall 28) is formed as a portion against which the cover side abutting part 24 of the upper cover 4 abuts. Further, the case side abutting part 14 (front projecting wall 28) is formed as a portion on which the cover side abutting part 24 slides in the upward/downward direction.

Slits 27 are formed at base end portions of the pair of projecting walls 28, respectively, like the above projecting walls 25. The slits 27 are formed so that it is possible to insert the right frame-formed sidewall 15 of the upper cover 4 into the slits 27. The slits 27 are cut to only have a width which is necessary for the right frame-formed sidewall 15 of the upper cover 4 to be lapped onto the outside of the right sidewall 7 of the body case 3.

In FIGS. 1A to 1E, the upper cover 4 has the frame-formed sidewalls 15, the top wall 16 and the obstacle avoiding part 17 as described above. The upper cover 4 is formed to engage (outwardly fit) with the body case 3 so that the opening part 6 can be covered. The frame-formed sidewalls 15 are formed to match the opening shape of the opening part 6 so that the opening part 6 can be surrounded. The frame-formed sidewalls 15 and the top wall 16 are formed to match the shapes and heights of the electrical components and the like that are mounted through the opening part 6. The obstacle avoiding part 17 is formed as a portion which escapes from other components 42 (refer to FIG. 6) to be described later which are attached above the electrical junction box 1 after the electrical junction box 1 is carried.

The upper cover 4 is formed into the shape as shown in the figures to have the cover side locking part 19, the cover side abutting part 20 and the cover side supporting part 21 at the left frame-formed sidewall 15 and the cover side locking part 23 and the cover side abutting part 24 at the right frame-formed sidewall 15 as described above.

In FIGS. 2 and 3, the cover side abutting part 20 and the cover side supporting part 21 of the left frame-formed sidewall 15 are formed and arranged near the cover side locking part 19. Specifically, when viewed from the operation position of an operator, the cover side abutting part 20 is formed and arranged before the cover side locking part 19 and the cover side supporting part 21 is formed and arranged after the cover side locking part 19.

The cover side locking part 19 of the left frame-formed sidewall 15 has a locking body 30 and a pair of protective walls 31. The cover side locking part 19 is formed into such a shape that the cover side locking part 19 can be inserted into the case side locking part 9 of the left sidewall 7. Further, the cover side locking part 19 is also formed into an engageable/disengageable shape.

The locking body 30 is formed into a cantilever arm strip shape which has flexibility. The locking body 30 is so formed that its base end portion is located at the upper side and its free end portion is located at the lower side. The free end portion is formed with an engaging projection 32 which slightly projects outward and has a claw-shaped section. The engaging projection 32 is formed into such a shape that the engaging projection 32 is hooked with the hooking part (not shown) of the case side locking part 9. After having been hooked with the hooking part not shown, the engaging projection 32 could be disengaged if the locking body 30 is flexed inward.

The pair of protective walls 31 is formed as portions which can prevent the locking body 30 from being flexed inward by an unintentional external force. Further, the pair of protective walls 31 is formed as portions which can guide at both sides of the locking body 30 when the cover side locking part 19 is inserted into the case side locking part 9 of the left sidewall 7.

The cover side abutting part 20 of the left frame-formed sidewall 15 is formed into, for example, the illustrated shape as a portion that abuts against the case side abutting part 10 of the body case 3. For example, when the cover side abutting part 20 is described more in detail, the cover side abutting part 20 includes an abutting wall 33, a reinforcing wall 34 and a reinforcing part 35. The cover side abutting part 20 is formed into the illustrated shape to include the above components and extend straightly downward from the edge of the left frame-formed sidewall 15.

The abutting wall 33 is formed as a portion that directly abuts against the case side abutting part 10 of the body case 3. The portion that abuts against the case side abutting part 10 is formed as a flat surface. The abutting wall 33 is also formed as a portion that is slideable on the case side abutting part 10. Because the cover side abutting part 20 extends downward from the edge of the left frame-formed sidewall 15, the abutting wall 33 is formed as a portion that acts onto the body case 3 before the cover side locking part 19 is engaged.

The reinforcing wall 34 and reinforcing part 35 are formed as portions that ensure the function of the abutting wall 33 which directly abuts against the case side abutting part 10 of the body case 3. In addition, as long as the function can be ensured, the reinforcing wall 34 and the reinforcing part 35 are not limited to the wall or pillar shape shown in the figures.

The cover side supporting part 21 of the left frame-formed sidewall 15 is formed and arranged so that the case side locking part 9 of the body case 3 is located between the cover side abutting part 20 and the cover side supporting part 21 (in other words, the case side locking part 9 is sandwiched). The cover side supporting part 21 is formed as a portion that, when the upper cover 4 is moved downward while the abutting wall 33 abuts against the case side abutting part 10 of the body case 3 (in an abutting state), can guide the downward movement.

For example, the cover side supporting part 21 includes a guiding wall 36, a reinforcing wall 37 and a reinforcing part 38. The cover side supporting part 21 is formed to include the above components and extend straightly downward from the edge of the left frame-formed sidewall 15. The cover side supporting part 21 is formed shorter than the cover side abutting part 20. It becomes hard for the cover side abutting part 20 to abut against the case side abutting part 10 of the body case 3 if the cover side supporting part 21 is too long.

The guiding wall 36 is formed to collaborate with the case side supporting part 11 of the body case 3 to serve a guiding function. The guiding wall 36 is formed into a flat surface. Because the cover side supporting part 21 extends downward from the edge of the left frame-formed sidewall 15, the guiding wall 36 is formed as a portion that may act onto the body case 3 before the cover side locking part 19 is engaged. A reference number 39 indicates a guiding part in the cover side supporting part 21. The guiding part 39 is formed as a portion to guide the case side supporting part 11. For example, the guiding part 39 is formed into a tapered shape.

In FIGS. 4 and 5, the cover side locking part 23 of the right frame-formed sidewall 15 is formed to have the same structure as that of the cover side locking part 19 of the left frame-formed sidewall 15 in the embodiment. That is, the cover side locking part 23 has a locking body 30 and a pair of protective walls 31. The cover side locking part 23 is formed into such a shape that the cover side locking part 23 can be inserted into the case side locking part 13 of the right sidewall 7. Further, the cover side locking part 23 is also formed into an engageable/disengageable shape.

The cover side abutting part 24 of the right frame-formed sidewall 15 is formed and arranged near the cover side locking part 23, and when viewed from the operation position of an operator, before the cover side locking part 23. The cover side abutting part 24 is formed to have the same structure as that of the cover side abutting part 20 of the left frame-formed sidewall 15 in the embodiment. That is, the cover side abutting part 24 includes an abutting wall 33, a reinforcing wall 34 and a reinforcing part 35. The cover side abutting part 24 is formed into the illustrated shape to extend straightly downward from the edge of the right frame-formed sidewall 15.

Further, the right frame-formed sidewall 15 may be additionally formed with the same functional portions as those of the cover side supporting part 21 of the left frame-formed sidewall 15.

Then, the operation of the features of the present invention will be described based on the above construction and structure. The description here is made with reference to FIGS. 6 to 9 and, if necessary, to FIGS. 1A to 5.

Figure 9:
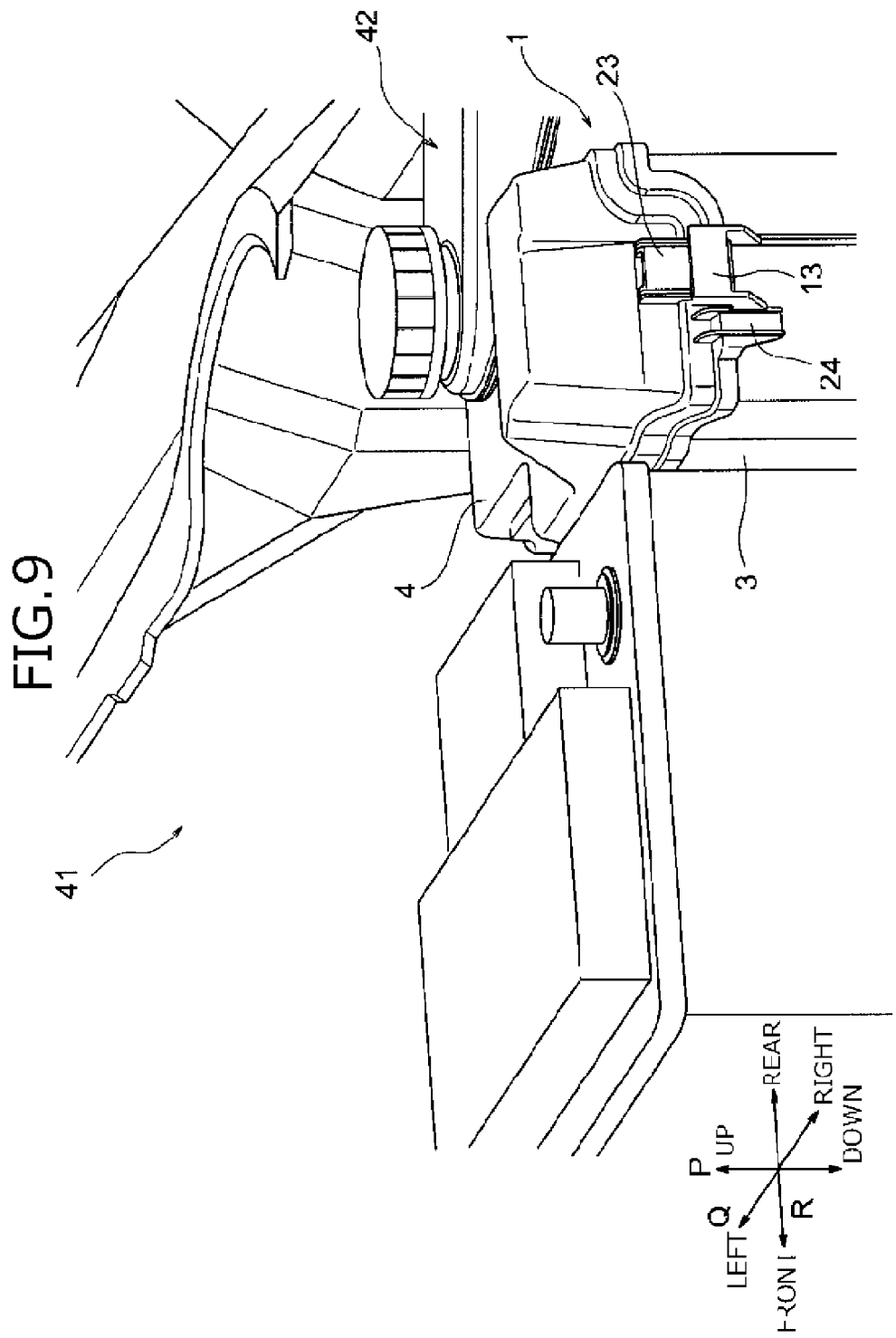
FIG. 9 is a perspective view which indicates that the upper cover is engaged to the body case.

FIG. 6 is a perspective view which indicates that an upper cover is removed from a body case. FIGS. 7A and 7B include perspective views which indicate states just before cover side and case side locking parts are engaged, in which FIG. 7A is a view from the left side, and FIG. 7B is a view from the right side. FIGS. 8A and 8B include perspective views which indicate that cover side and case side locking parts are engaged, in which FIG. 8A is a view from the left side, and FIG. 8B is a view from the right side. FIG. 9 is a perspective view which indicates that the upper cover is engaged to the body case.

In FIG. 6, the electrical junction box 1 is installed in an engine room 41 of an automobile. After the electrical junction box 1 is installed, other components 42 are attached above the electrical junction box 1. In FIG. 6, the inside (the detailed illustration is omitted as a grid) of the electrical junction box 1 appears through the opening part 6.

When the upper cover 4 is to be engaged, the upper cover 4 cannot be engaged by being moved simply in the upward/downward direction in which the locking parts are engaged or disengaged. Specifically, because the other parts 42 are above the body case 3 as illustrated, an operator cannot make the upper cover 4 engaged unless the upper cover 4 is inserted between the body case 3 and the other parts 42. At this time, although the operator operates while fumbling with a hand stretching, in the present invention, because the features of the present invention acts effectively, the upper cover 4 can be precisely engaged to a predetermined position of the body case 3.

That is, when the upper cover 4 is moved to above the body case 3, the cover side abutting part 20 of the upper cover 4 abuts against the case side abutting part 10 of the body case 3, as shown in FIG. 7. The cover side abutting part 24 of the upper cover 4 also abuts against the case side abutting part 14 of the body case 3. Even if the operator cannot visually inspect, by these abutments, the operator can easily know the position where the upper cover 4 is engaged to the body case 3.

After the cover side abutting part 20 abuts against the case side abutting part 10 and the cover side abutting part 24 abuts against the case side abutting part 14, when the upper cover 4 is moved downward, after the cover side locking part 19 of the upper cover 4 is inserted into the case side locking part 9 of the body case 3, a temporary setting state just before the engagement is reached. Further, after the cover side locking part 23 of the upper cover 4 is inserted into the case side locking part 13 of the body case 3, a temporary setting state just before the engagement is reached at this part. Just before the temporary setting state is reached, the cover side supporting part 21 of the upper cover 4 and the case side supporting part 11 of the body case 3 collaborate and serve a guiding function.

Finally, when the operator pushes the upper cover 4 downward by hand, the case side locking part 9 of the body case 3 and the cover side locking part 19 of the upper cover 4 are engaged to reach a locked state as shown in FIG. 8. Further, likewise, the case side locking part 13 of the body case 3 and the cover side locking part 23 of the upper cover 4 are engaged to reach a locked state at this part. When these locked states are reached, the upper cover 4 can be engaged as shown in FIG. 9.

As described above with reference to FIGS. 1A to 9, according to the present invention, when the opening part 6 of the body case 3 is covered with the upper cover 4 and the upper cover 4 is moved in a predetermined direction intersecting the engaging direction (downward direction), the cover side abutting parts 20, 24 abut against the case side abutting parts 10, 14 by this movement. Temporarily, even when there is no enough space above the electrical junction box 1 or when it is impossible to visually inspect the position where the upper cover 4 is engaged to the body case 3, because of the above-mentioned abutments, the position can be known and the upper cover 4 can be precisely engaged to the body case 3. Therefore, according to the present invention, an effect is achieved which is that maintenance-related operativity can be improved.

Further, according to the present invention, because the cover side abutting parts 20, 24 and the case side abutting parts 10, 14 are formed and arranged near the positions where the cover side locking parts 19, 23 and the case side locking parts 9, 13 are engaged, in comparison to that the cover side abutting parts 20, 24 and the case side abutting parts 10, 14 are formed and arranged far away, the upper cover 4 can be more precisely engaged to the body case 3. Therefore, according to the present invention, an effect is achieved which is that maintenance-related operativity can be improved.

Further, according to the present invention, because when the upper cover 4 is moved in the engaging direction while the cover side abutting parts 20, 24 abut against the case side abutting parts 10, 14, a guiding is performed by the cover side supporting part 21 and the case side supporting part 11, the upper cover 4 can be precisely and smoothly engaged to the body case 3. Therefore, according to the present invention, an effect is achieved which is that maintenance-related operativity can be improved.

Further, according to the present invention, because the cover side supporting part 21 and the cover side abutting part 20 are formed and arranged at the position to sandwich the cover side locking part 19, and because the case side supporting part 11 and the case side abutting part 10 are formed and arranged at the position to sandwich the case side locking part 9, the upper cover 4 can be engaged to the body case 3 in a stable state without a position deviation. Therefore, according to the present invention, an effect is achieved which is that maintenance-related operativity can be improved.

It is apparent that various modifications can be made to the invention without changing the purpose of the invention.

What is claimed is:

1. An electrical junction box comprising:
    a body case of the electrical junction box that has an opening part facing electrical components and has a case side locking part; and
    a cover that covers the opening part, is engaged to the body case of the electrical junction box, and has a cover side locking part,
    wherein the cover is engaged to or disengaged from the body case of the electrical junction box with the case side locking part and the cover side locking part,
    the cover has a cover side abutting part to match a position of the cover side locking part,
    the body case of the electrical junction box has a case side abutting part to match a position of the case side locking part and a position of the cover side abutting part,
    the cover side abutting part and the case side abutting part are formed and arranged at positions where the cover side abutting part and the case side abutting part abut against each other when the opening part is covered with the cover and the cover is moved in a predetermined direction that intersects an engaging direction in which the cover is engaged to or disengaged from the body case of the electrical junction box, and
    the cover side locking part includes a locking body and a pair of protective walls.

2. The electrical junction box according to claim 1, wherein the cover side abutting part is arranged near the cover side locking part and formed into a wall-like or columnar shape which extends in the engaging direction, and
    the case side abutting part includes the case side locking part and is formed of a wall that extends in the engaging direction.

3. The electrical junction box according to claim 1, wherein the cover and the body case of the electrical junction box have a cover side supporting part and a case side supporting part, and
    the cover side supporting part and the case side supporting part are formed to, when the cover is moved in the engaging direction while the cover side abutting part abuts against the case side abutting part, guide the movement.

4. The electrical junction box according to claim 3, wherein the cover side supporting part and the case side supporting part are formed and arranged at positions to sandwich the cover side locking part and the case side locking part with the cover side abutting part and the case side abutting part.

* * * * *